(12) United States Patent
Barczyk et al.

(10) Patent No.: US 10,845,394 B2
(45) Date of Patent: Nov. 24, 2020

(54) NULL DETECTOR DEVICES AND SYSTEMS EMPLOYING SAME

(71) Applicant: GUILDLINE INSTRUMENTS LIMITED, Smiths Falls (CA)

(72) Inventors: Tomasz Barczyk, Ottawa (CA); Richard Timmons, Ottawa (CA); Mark Evans, Kingston (CA)

(73) Assignee: GUILDLINE INSTRUMENTS LIMITED, Smiths Falls (CA)

( * ) Notice: Subject to any disclaimer, the term of this patent is extended or adjusted under 35 U.S.C. 154(b) by 176 days.

(21) Appl. No.: 16/208,016

(22) Filed: Dec. 3, 2018

(65) Prior Publication Data

US 2019/0170796 A1    Jun. 6, 2019

Related U.S. Application Data

(60) Provisional application No. 62/594,155, filed on Dec. 4, 2017.

(51) Int. Cl.
| | |
|---|---|
| *G01R 17/14* | (2006.01) |
| *G01R 15/22* | (2006.01) |
| *G01R 15/24* | (2006.01) |
| *H03F 3/08* | (2006.01) |
| *G01R 19/10* | (2006.01) |
| *H03F 3/38* | (2006.01) |

(52) U.S. Cl.
CPC ............. *G01R 17/14* (2013.01); *G01R 15/22* (2013.01); *G01R 15/241* (2013.01); *G01R 19/10* (2013.01); *H03F 3/08* (2013.01); *H03F 3/38* (2013.01)

(58) Field of Classification Search
CPC ......... G01S 1/00; G01S 2205/00; G01N 1/00; G01N 2201/00; G01C 1/00; G01R 1/00; G05D 1/00; G05D 2201/00
See application file for complete search history.

(56) References Cited

U.S. PATENT DOCUMENTS

| | | | | |
|---|---|---|---|---|
| 3,999,117 A | * | 12/1976 | Gyugyi ................. | H02J 3/1864 323/211 |
| 4,802,367 A | * | 2/1989 | Petersen .................. | G01N 3/08 73/805 |
| 6,542,772 B1 | * | 4/2003 | Chance ................ | A61B 5/0073 600/473 |

* cited by examiner

*Primary Examiner* — Jermele M Hollington
*Assistant Examiner* — Temilade S Rhodes-Vivour
(74) *Attorney, Agent, or Firm* — Greer, Burns & Crain, Ltd.

(57) ABSTRACT

Within electrical test equipment systems comparator bridges are employed to provide the required dynamic range, accuracy, and flexibility. However, whilst bridge based measurement configurations remove many of the issues associated with making measurements at accuracies of sub-parts, a part, or few parts per million they still require, in many instances, that a null point be determined where the bridge is balanced. However, this becomes increasingly difficult within electrically noisy environments, with modern digital multimeters, and where the desired measurement point within the electrical system is physically difficult to access particularly when improved accuracy in calibration, standards, and measurements on circuits and components means measurement systems must operate at 50 parts per billion (ppb) and below. In order to address this, a null detector design is provided supporting operation within such electrically noisy environments with physical separation of the null detector measurement circuit from the electrical test equipment.

11 Claims, 8 Drawing Sheets

ND DETECTOR DEVICES AND SYSTEMS
NULL DETECTOR DEVICES AND SYSTEMS EMPLOYING SAME

CROSS-REFERENCE TO RELATED APPLICATIONS

This patent application claims the benefit of 35 USC 119 priority from U.S. Provisional Patent Application 62/594,155 filed Dec. 4, 2017 entitled "Null Detector Devices and Systems Employing Same" which is incorporated by reference.

BACKGROUND

This invention relates generally to null detection devices for precision electrical measurements and precision transducers over current ranges from 1 mA or less to 20 kA or greater and voltage ranges of 1V or less to 1000 kV or greater and over frequency ranges from DC to hundreds of kilohertz. In particular, it relates to null detectors supporting precision electrical measurements within electrically noisy environments or at points within systems incompatible with placement of electrical test equipment.

Direct Current (DC) and Alternating Current (AC) electrical measurements are used in a wide variety of applications and may be performed for a variety of electrical quantities including voltage, current, capacitance, impedance, resistance etc. These tests and measurements include those relating to designing, evaluating, maintaining, calibrating and servicing electrical circuits and equipment from high voltage electrical transmission lines operating at different currents and voltages for a wide range of applications including those within industrial, scientific, military, medical and consumer fields for a wide variety of electrical and electronic devices directly or systems indirectly requiring precision electronic and electrical control. Accordingly, a wide range of electrical test and measurement systems are employed in the design, evaluation, maintenance, servicing and calibration of such electronic and electrical control circuits, systems and devices.

Within a variety of electrical measurement applications and electrical test equipment systems comparator bridges are employed to provide the required dynamic range, accuracy, and flexibility. Whilst bridge based measurement configurations remove many of the issues associated with achieving making measurements at accuracies of a part, or few parts per million, such as insensitivity to lead resistances, excellent ratio linearity, excellent ratio stability, and a high level of resolution they still require in many instances that a null point be determined where the bridge is balanced.

However, this becomes increasingly difficult within electrically noisy environments, with modern digital multimeters, and where the desired measurement point within the electrical system is physically difficult to access. Accordingly, in order to address these issues and meet the continued drive for improved accuracy in calibration, standards, and measurements on circuits and components means many measurements and measurement systems are operating at 50 parts per billion (ppb) and below to approximately 5 ppb the inventors have established a null detector design supporting operation within such electrically noisy environments with physical separation of the null detector measurement circuit from the electrical test equipment.

Other aspects and features of the present invention will become apparent to those ordinarily skilled in the art upon review of the following description of specific embodiments of the invention in conjunction with the accompanying figures.

SUMMARY

It is an object of the present invention to mitigate limitations within the prior art relating to null detection devices for precision electrical measurements and precision transducers over current ranges from 1 mA or less to 20 kA or greater and voltage ranges of 1V or less to 1000 kV or greater and over frequency ranges from DC to hundreds of kilohertz. In particular, it relates to null detectors supporting precision electrical measurements within electrically noisy environments or at points within systems incompatible with placement of electrical test equipment.

In accordance with an embodiment of the invention there is provided a device comprising:
an input port comprising an upper signal rail and a lower signal rail;
a first resistor having a first end coupled to the upper signal rail of the input port;
a second resistor having a first end coupled to the upper signal rail of the input port; a third resistor having a first end coupled to the other end of the first resistor and a second distal end coupled to the lower signal rail of the input port;
a fourth resistor having a first end coupled to the other end of the second resistor and a second distal end coupled to the lower signal rail of the input port;
a first output port coupled to the other end of the first resistor and the first end of the third resistor;
a second output port coupled to the other end of the second resistor and the first end of the fourth resistor;
wherein
   in a first configuration the first resistor and fourth resistor are light dependent resistors which are each optically illuminated with first synchronized optical signals having the same time dependent variation in illumination;
   in a second configuration the second resistor and third resistor are light dependent resistors which are each optically illuminated with second synchronized optical signals having the same time dependent variation in illumination;
   in a third configuration the first resistor and fourth resistor are light dependent resistors which are each optically illuminated with third synchronized optical signals having the same time dependent variation in illumination and the second resistor and third resistor are light dependent resistors which are each optically illuminated with synchronized fourth optical signals having the same time dependent variation in illumination.

In accordance with an embodiment of the invention there is provided a method comprising:
providing a resistive bridge circuit comprising N light dependent resistors (LDRs) and M=N-4 resistors, where both N is an integer and has a value $1 \leq N \leq 4$; and
driving the N light dependent resistors with R optical signals having a pulse repetition frequency $f_0$ and each pulse having a predetermined intensity profiles.

In accordance with an embodiment of the invention there is provided a method comprising:
providing a measurement head;
providing a measurement circuit;
transmitting from the measurement circuit to the measurement head a plurality of first optical signals to the measurement head in order to at least one of power, configure, and control the measurement head; and transmitting from the measurement head to the measurement circuit one or more second optical signals to the measurement circuit, the one or more second optical signals transmitting data relating to an electrical measurement performed with the measurement head.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to null detection devices for precision electrical measurements and precision transducers over current ranges from 1 mA or less to 20 kA or greater and voltage ranges of 1V or less to 1000 kV or greater and over frequency ranges from DC to hundreds of kilohertz. In particular, it relates to null detectors supporting precision electrical measurements within electrically noisy environments or at points within systems incompatible with placement of electrical test equipment.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Figure 1:
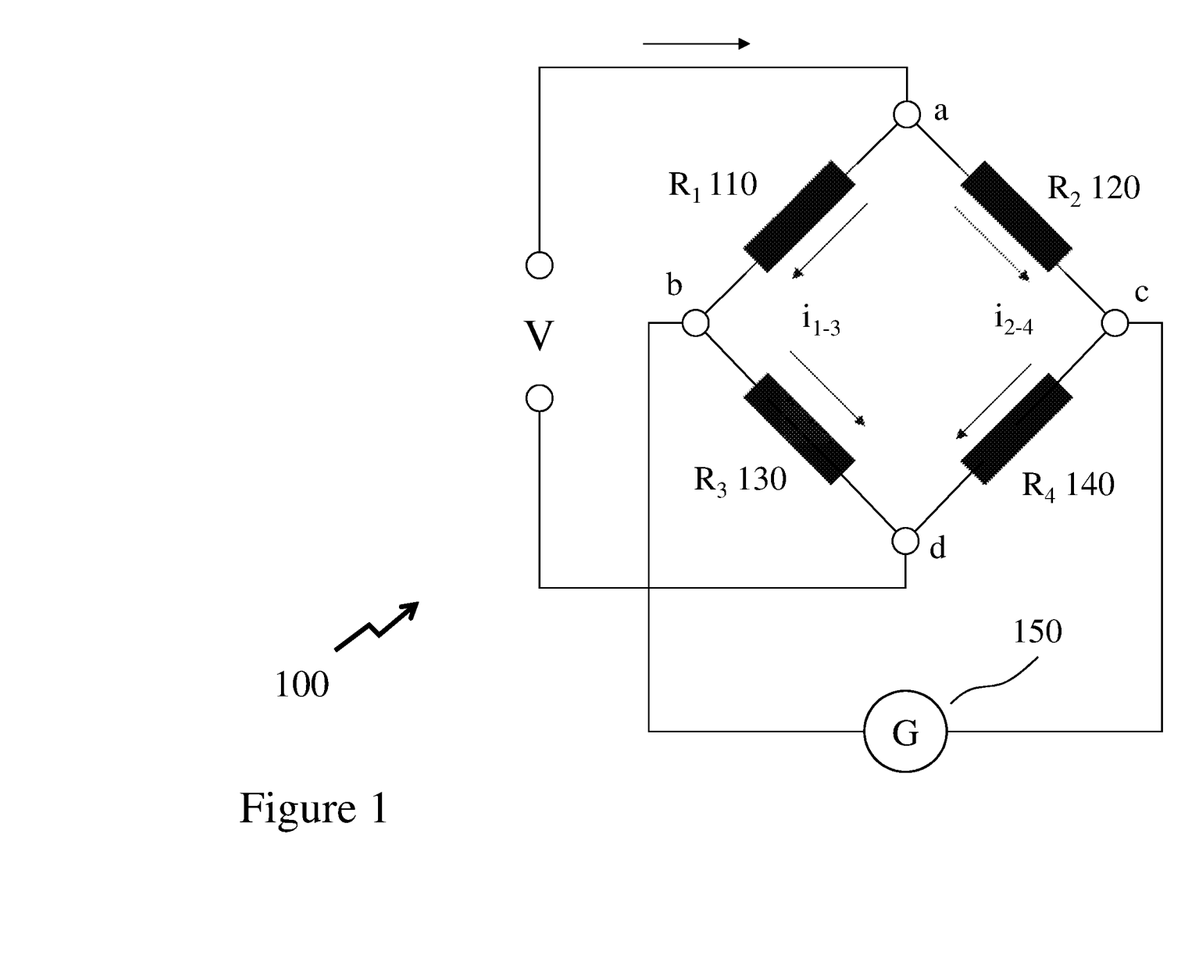
FIG. 1 depicts a resistive bridge in the form of a Wheatstone bridge.

Now referring to FIG. 1 there is depicted a Wheatstone Bridge Circuit 100 for an electrical circuit used to measure an unknown electrical resistance by balancing two legs of a bridge circuit wherein one leg of the bridge circuit includes an unknown component. As depicted the Bridge Circuit 100 comprises a first leg between node a and node d disposed across an input voltage, V, comprising R1 110 and R3 130 and a second leg also disposed between node a and node d across the input voltage, V, comprising R2 120 and R4 140. The output, G, being measured across nodes b and c with meter 150. Accordingly, within the first leg a first current $i_{1-3}$, flows which is given by Equation (1) below. Similarly, in the second leg a second current $i_{2-4}$ flows as given by Equation (2). Accordingly, the voltage differentials between nodes b and a or c and a are given by Equations (3) and (4) respectively which thereby define the output, G, by Equation (5). Accordingly, the relationship between G and V is defined by Equation (6). Hence, knowing R1 110, R2 120, and R4 140 allows determination of R3 130 or where R3 130 is variable, R1 110 and R2 120 are known then R4 140 can be found based upon adjusting R3 130 until G=0.

$$i_{1-3} = \frac{V}{R_1 + R_3} \quad (1)$$

$$i_{2-4} = \frac{V}{R_2 + R_4} \quad (2)$$

$$V_b - V_a = \frac{VR_1}{R_1 + R_3} \quad (3)$$

$$V_c - V_a = \frac{VR_2}{R_2 + R_4} \quad (4)$$

$$G = V_c - V_a \quad (5)$$

$$\frac{G}{V} = \frac{R_2 R_3 + R_1 R_4}{(R_1 + R_3) + (R_2 + R_4)} \quad (6)$$

Accordingly, when measuring the scenario where G=0 then the output from the Bridge Circuit 100 is today typically coupled to an electrical multimeter. However, an electrical multimeter if employed as a null detector is not an appropriate selection as the "zero" state of the electrical multimeter moves and therefore the apparently determined null will not be the null shortly thereafter as the electrical multimeter drifts. This arises in part from the large number of protection circuits within a multi-function electrical multimeter that result in a large number of leakage currents within the electrical multimeter which impact the measurement circuits when seeking to make an "absolute" null measurement. Accordingly, the meter 150 may be replaced with a null detector such as described and depicted below in respect of embodiments of the invention. Further, the Bridge Circuit 100 may be replaced with bridge circuits according to embodiments of the invention such as described and depicted below in respect of FIGS. 3 to 5 respectively.

Figure 2:
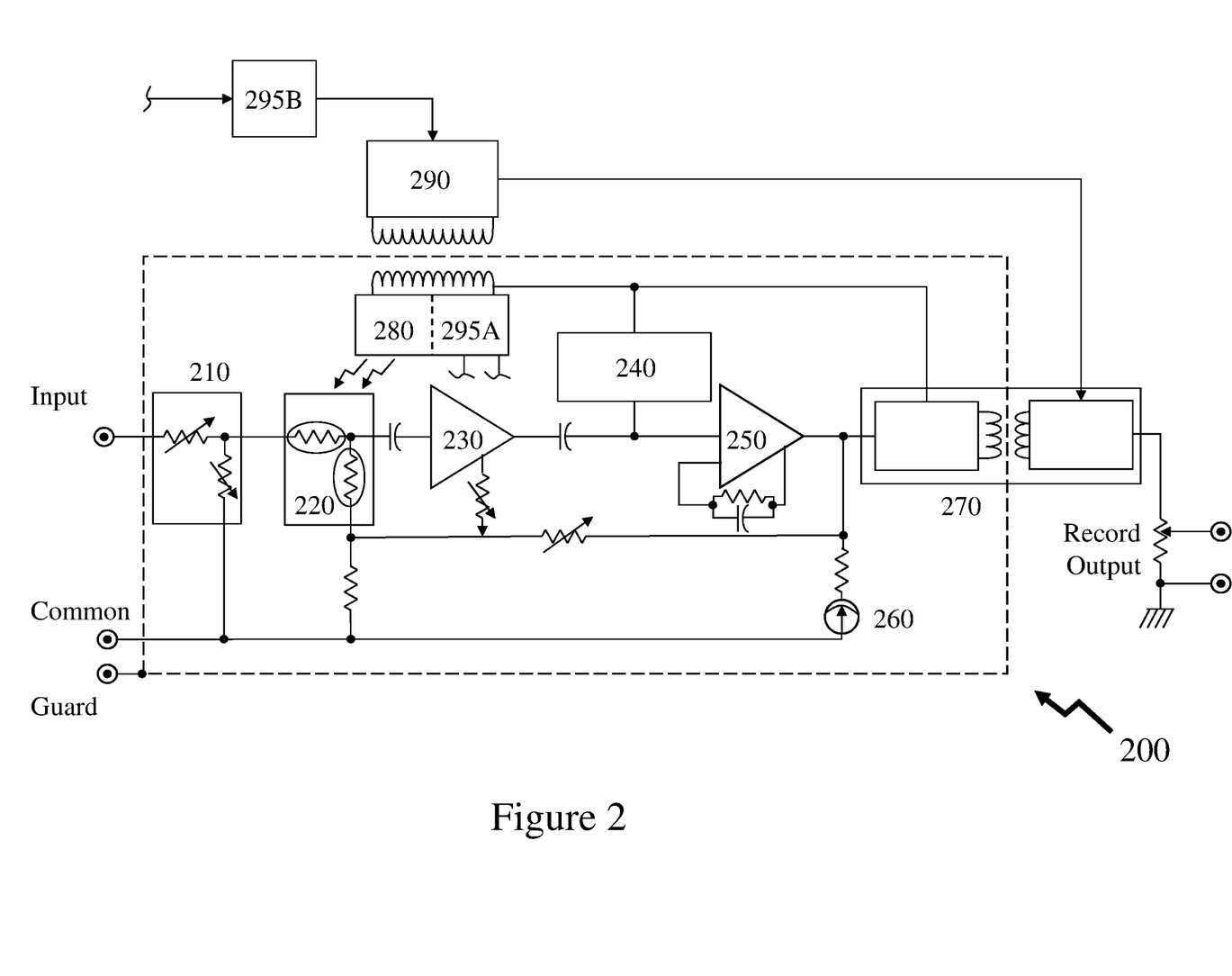
FIG. 2 depicts a null detector employing optical isolation of the measurement circuit from the electrical circuit.

Now referring to FIG. 2 there is depicted a schematic of a Null Meter Circuit 200 which may be an alternative option for meter 150. The Null Meter Circuit 200 provides the user with a single function with low complexity electrical circuit and a direct visual indication of the voltage such that the effect of adjustment of a tunable resistor (potentiometer) within the Bridge Circuit 100 is visible to the user. As depicted the Null Meter Circuit 200 employs a photo-chopper stabilized amplifier with the overall gain of the amplifier being precisely controlled by negative feedback. The primary circuits are an input range divider 210, a photocell modulator 220, an AC amplifier 230, a synchronous demodulator 240, a DC amplifier 250, a meter 260, an isolation converter 270, a neon drive 280, an 84 Hz multi-vibrator 290, a supply rectifier 295A, and a rectifier filter 295B.

The input range divider 210 provides a fixed input impedance to signals of less than a predetermined input voltage, e.g. 1 millivolt, and allows reduction of input signals above this predetermined threshold. The photo-choppers 220 modulate the input signal to the DC amplifier at 84 Hz, although an alternate frequency can be used. The drive signal for the photo-chopper 220 signal modulator is provided by the neon drive 280 which is composed of neon lamps driven alternately at a predetermined frequency, e.g. 84 Hz, by the multi-vibrator 290. 84 Hz being a signal having a frequency asynchronous with the power line frequencies of 50 Hz and 60 Hz and power line harmonics. However, other frequencies for the multi-vibrator 290 may be employed. The multi-vibrator 290 also drives the supply rectifiers 295A which provide operating voltages for the amplifiers, the isolation converter 270 which provides the isolated output for coupling to a chart recorder etc., and the synchronous demodulator 240 which demodulates the amplified DC signal. The entire amplifier and secondary circuits, an example of which being transformers, are surrounded by a guard shield which permits the use of external guard voltages.

Accordingly, the input DC signal is modulated and amplified by the AC amplifier 230 which is a high impedance amplifier whose gain is controlled by a resistance selected by a range control. The amplified signal is then detected by the synchronous demodulator driven by the 84 Hz reference signal and detects the amplified DC signal. The detected DC signal is then amplified by a DC amplifier 250 whose gain is controlled by fixed feedback. The output signal of the DC amplifier 250 drives the meter which indicates the polarity and magnitude of the measured voltage, and the isolation converter 270 which drives the isolated recorder output. This same DC signal is also fed back to the input of the AC amplifier 230 to control overall amplifier gain. The feedback ratio is determined by the setting of the range control and allows overall amplifier gain to be precisely controlled.

Figure 3:
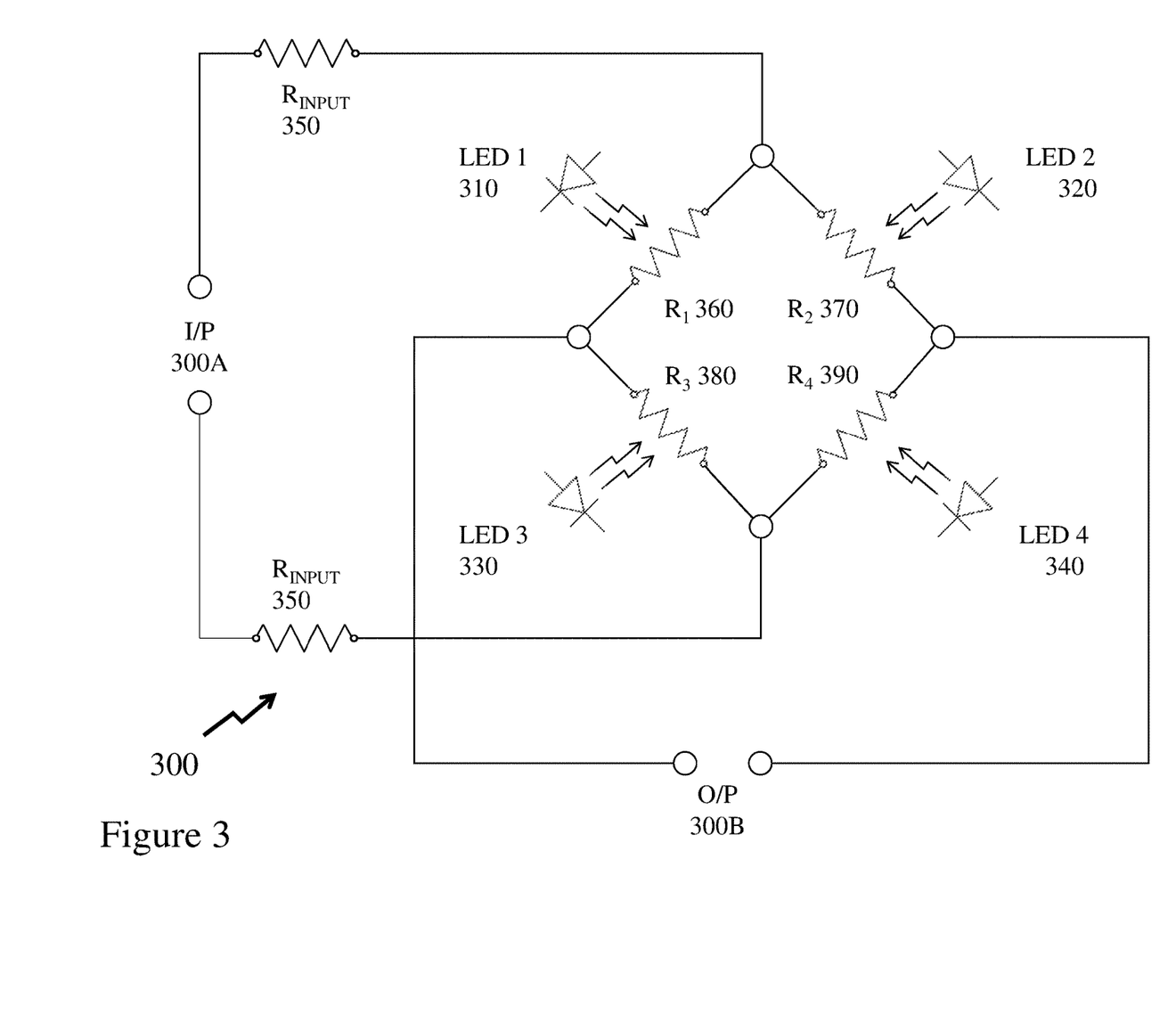
FIG. 3 depicts a resistive bridge according to an embodiment of the invention employing optical driving of the resistors within the resistive bridge.

Whilst the Null Meter Circuit 200 employs a chopper allowing AC amplification and processing of the original DC measurement signal it does not have any direct impact upon the bridge circuit and accordingly automating any electrical potentiometer adjustment for the automation of electrical circuit measurements. Accordingly, the inventors have established an inventive bridge circuit such as depicted in FIG. 3 by Bridge Circuit 300 operating according to an embodiment of the invention employing optical driving of the resistors within the resistive bridge. The Bridge Circuit 300 satisfies underlying design goals wherein the exploitation of dual "optical chopping" provides for a balanced circuit relative to the input and wherein high frequency "optical chopping" provides for improved timing information.

Within the design methodology of the inventors then two key areas are addressed with respect to the null detector concepts and bridge circuits employing such null detectors. Firstly, the design methodology addresses the need to minimize crosstalk from any modulating signals employed within the circuit(s) so that these do not affect the source which the circuits are trying to balance. In order to achieve this, the inventors exploit proper shaping of the modulating drive signal(s) such as described and depicted below in respect of FIG. 6. Secondly, it is important to isolate modulator and detector circuits from the output of any instrument employing the null detector concepts and bridge circuits according to embodiments of the invention to minimize input bias current which is addressed within null detector concepts and bridge circuits by using optical isolation between the relevant circuit portions such as described and depicted in respect of FIGS. 3 to 5 respectively.

Accordingly, as depicted Bridge Circuit 300 comprises an input 300A which is coupled to the bridge via input resistors, $R_{INPUT}$, and an output 300B. The bridge itself comprises first to fourth photoresistive elements (PREs) R1 360, R2 370, R3 380, R4 390 respectively which are optically illuminated by first to fourth optical sources LED1 310, LED2 320, LED3 330, and LED4 340 respectively. Consider an initial case that each of the first to fourth optical sources LED1 310, LED2 320, LED3 330, and LED4 340 respectively are off and that R4 is in fact an unknown. Accordingly, if LED3 330 is now activated then the resistance of the third PRE R3 380 will vary and the output 300B can be monitored to determine when a null is obtained and hence based upon the known characteristics of the third PRE R3 380 and the output of the third optical source LED3 330 the value of the third PRE R3 380 when the output is nulled can be determined. As the third optical source LED3 330 can be varied under control of a microprocessor or microcontroller then the null detection process can be automated. Alternatively, different PREs can be activated or within other embodiments of the invention only part of the Bridge Circuit 300 employs PREs instead of fixed resistors or electrical potentiometers.

A photoresistive element (PSE), also known as a photo-resistor, light-dependent resistor (LDR), or photo-conductive cell, is a light-controlled variable resistor. The resistance of a photoresistor decreases with increasing incident light intensity; in other words, it exhibits photoconductivity. A photoresistor is made of a high resistance semiconductor such that in the dark, a PSE can have a resistance as high as several megaohms (Me), while in the light, a photoresistor can have a resistance as low as a few ohms according to the design. If incident light on a photoresistor exceeds a certain frequency, photons absorbed by the semiconductor give bound electrons enough energy to jump into the conduction band. The resulting free electrons (and their hole partners) conduct electricity, thereby lowering resistance. The resistance range and sensitivity of a photoresistor can substantially differ among dissimilar devices. Moreover, unique photoresistors may react substantially differently to photons within certain wavelength bands.

A photoelectric device can be either intrinsic or extrinsic. An intrinsic semiconductor has its own charge carriers and is not an efficient semiconductor, for example, silicon. In intrinsic devices the only available electrons are in the valence band, and hence the photon must have enough energy to excite the electron across the entire bandgap. Extrinsic devices have impurities, also known as dopants, added whose ground state energy is closer to the conduction band; since the electrons do not have as far to jump, lower energy photons (that is, longer wavelengths and lower frequencies) are sufficient to trigger the device. For example, phosphorous is one such dopant for silicon and is therefore an example of an extrinsic semiconductor. Alternatively, the PSE may be a photodiode or phototransistor although these have higher non-linearity that of an LDR.

In order to achieve a design goal of providing a balanced input bridge circuit according to embodiments of the invention exploit dual choppers illuminating the PSEs and employ predistortion of the optical signals coupled to the PSEs in order to exploit the characteristics of the PSE to establish fast response, better sensitivity etc. as discussed below in respect of FIG. 6. However, the invention can be implemented without the use of a chopper. Whilst embodiments of the invention depicted in FIGS. 4 and 5 below are for a remote measurement head coupled to an electrical analyser (electrical measurement equipment) it would be evident that the remote test heads may be integrated within the electrical analyser.

Optionally, embodiments of the invention may be floated in order to revise leakage currents. Overall embodiments of the invention may be employed to mask the load to the receiver and/or remove any DC offset in the front-end and provide improved common mode resistance/rejection.

Figure 4:
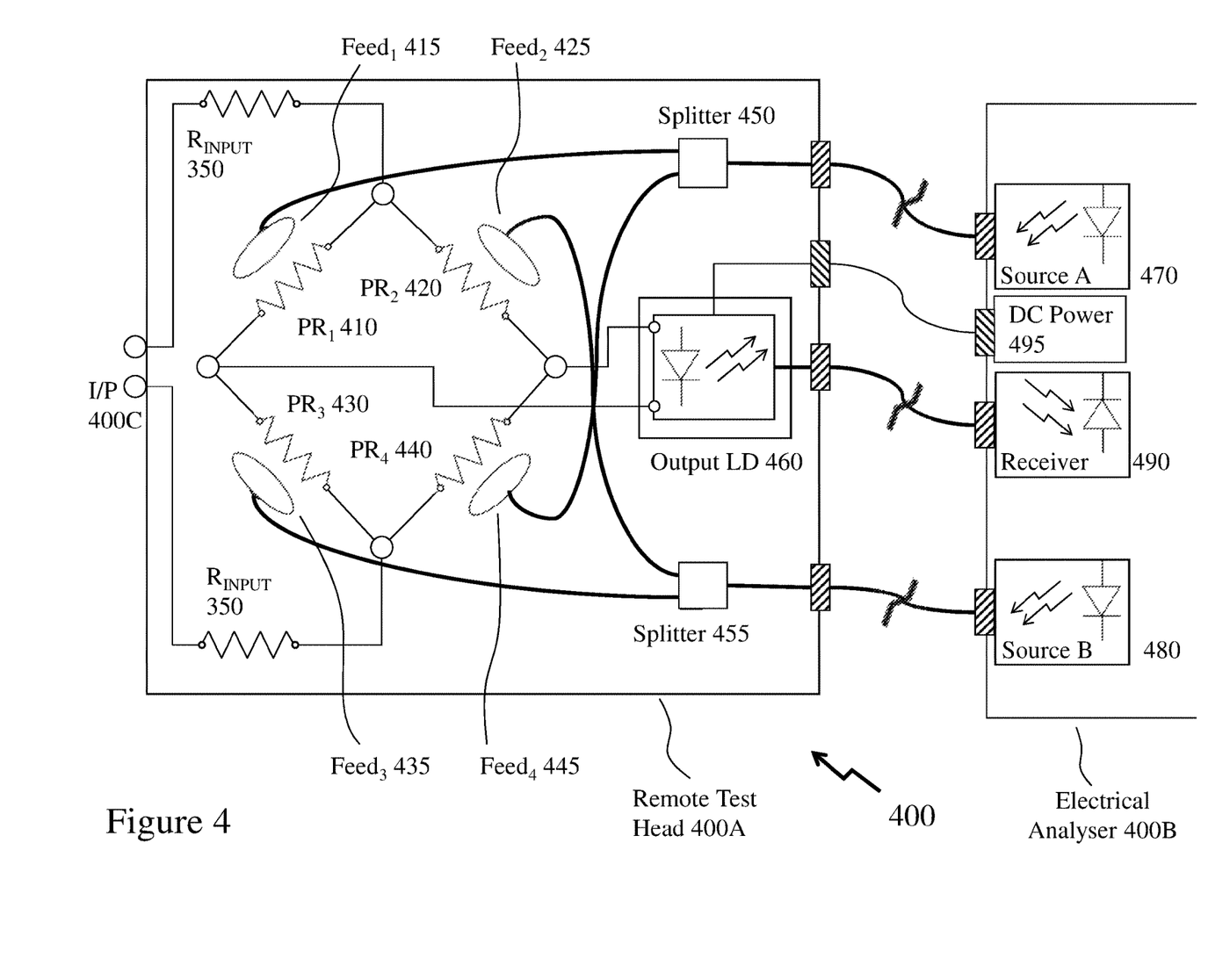
FIG. 4 depicts a resistive bridge according to an embodiment of the invention employing optical driving of the resistors within the resistive bridge with a measurement head separated from the electrical test equipment.

Accordingly, referring to FIG. 4 depicts a Remote Test Head (RTH) 400A according to an embodiment of the invention employing optical driving of the resistors within the resistive bridge with a measurement head separated from the electrical test equipment. Accordingly, the RTH 400A is coupled to the Electrical Analyser (ELEAL) 400B via optical connections and a single electrical link. As depicted a first optical emitter Source A 470 is coupled from the ELEAL 400B to the RTH 400A and therein to first splitter 450 from which the outputs are coupled to first PRE (PR1) 410 and fourth PRE (PR4) 440. A second optical emitter Source B 480 is coupled from the ELEAL 400B to the RTH 400A and therein to second splitter 455 from which the outputs are coupled to second PRE (PR2) 420 and third PRE (PR3) 430. Also coupled from the ELEAL 400B to RTH 400A is DC Power 495 which provides electrical power to the Output LD 460 which transmits the output voltage across node b and c to the ELEAL 400B. Each of the first to fourth PREs R1 410, R2 420, R3 430, and R4 440 are coupled to their respective optical source via first to fourth Optical Feeds, Feed1 415, Feed2 425, Feed3 435, and Feed4 445. The Input 400C being coupled to the bridge circuit via Input Resistors, $R_{INPUT}$ 350.

Figure 5:
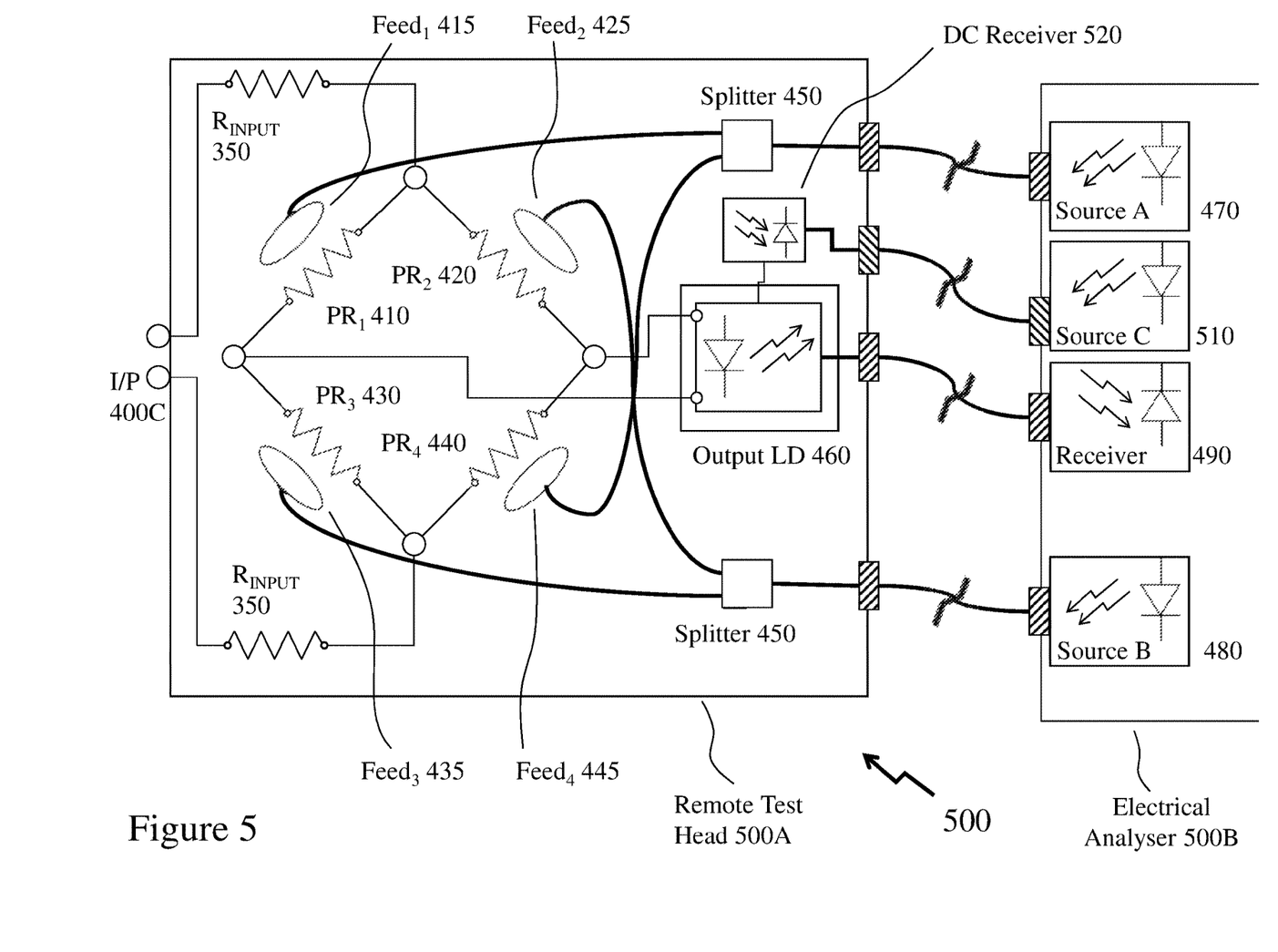
FIG. 5 depicts a resistive bridge according to an embodiment of the invention employing optical driving of the resistors within the resistive bridge with a measurement head separated from the electrical test equipment.

Accordingly, referring to FIG. 5 depicts a Remote Measurement Head or Remote Test Head (RTH) 500A according to an embodiment of the invention employing optical driving of the resistors within the resistive bridge with a measurement head separated from the electrical test equipment. Accordingly, RTH 500A and ELEAL 500B are structurally and functionally very similar to that depicted in FIG. 4 with RTH 400A and ELEAL 400B except that now the RTH 500A is only connected via optical connections. Hence, the electrical connection depicted in FIG. 4 is replaced with the Source C 510 within the ELEAL 500B and DC Receiver 520 within the RTH 500A to deliver optical power for generating the necessary current to drive the Output LD 460. The optical power delivery may be a power-over-fiber system (or power-by-light) according to an industry standard or non-standard system.

Whilst the RTH 400A and 500A in FIGS. 4 and 5 are depicted as remote from the ELEAL 400B and 500B it would be evident that the RTH may be integrated within the ELEAL but would in this instance be electrically isolated and floating relative to the ELEAL 400B or 500B.

It would be evident that depending upon the optical fiber loss characteristics, optical wavelength, optical power etc. required for the LDRs that the RTH 400A or 500A in FIGS. 4 and 5 can be physically employed at different maximum distances from the ELEAL such as 1 m (3 feet), 2 meters (6.5 feet), 5 meters (feet), 10 meters (16 feet), 50 meters (164 feet), 100 meters (328 feet), 500 m (1,640 feet) and 1000 meters (3,280 feet, 0.6 mile), or more.

Figure 6:
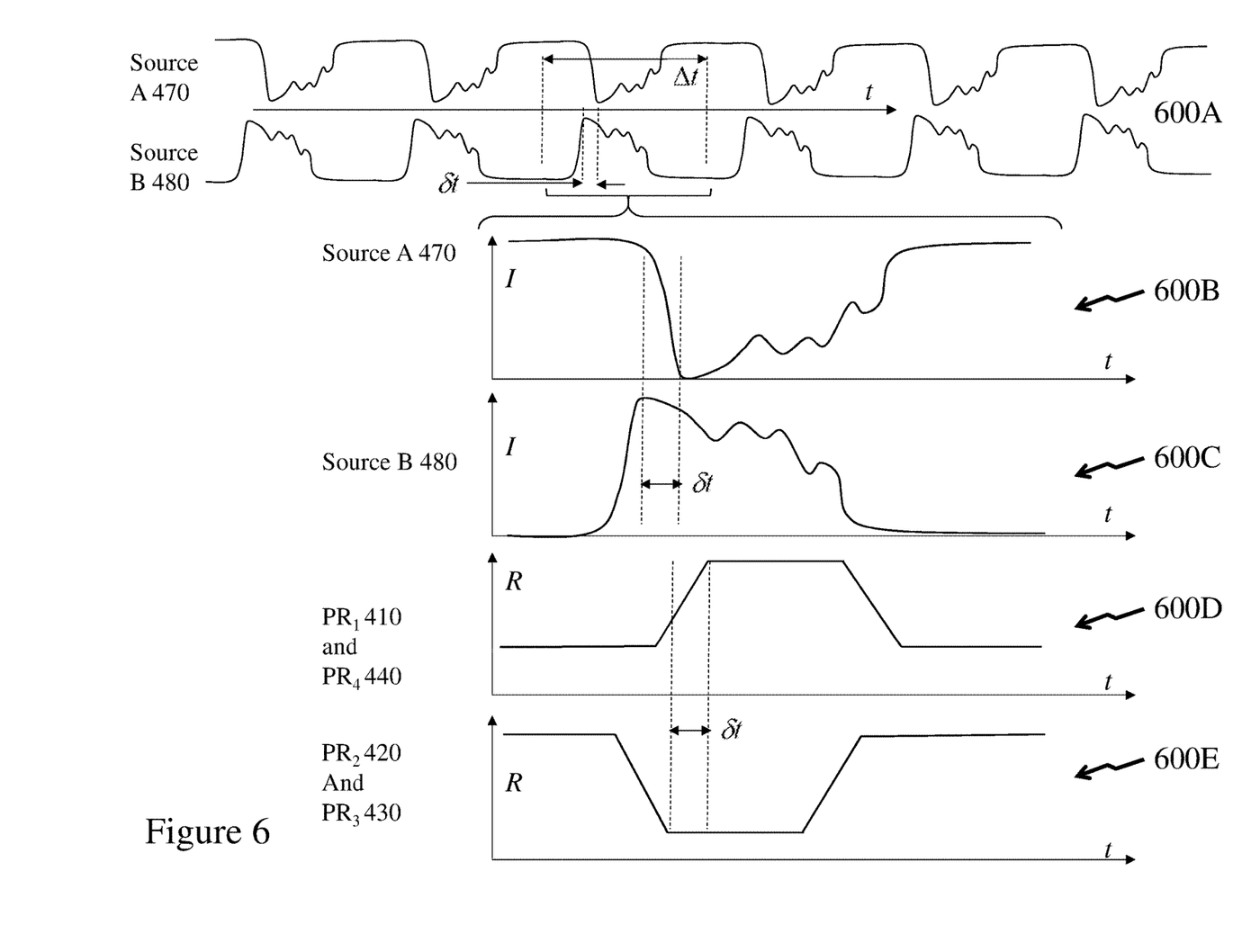
FIG. 6 depicts schematically shaped optical pulses for linear resistive element variation together with offset temporal variations of first and second resistor pairs within resistive bridge.

As depicted in FIG. 6 with first traces 600A the outputs of Optical Source A 470 and Optical Source B 480 as employed within ELEAL 400B and ELEAL 500B in FIGS. 4 and 5 respectively are depicted. It is evident that these are the inverse of one another with a time offset δt and repetition period Δt, the latter leading to a repetition frequency $f_0=1/\Delta t$. Accordingly, the PREs are driven by their respecting optical sources to either increase in resistance (reducing optical illumination) or decrease in resistance (increasing optical illumination). Accordingly, the output voltage is a function of optical illumination at the frequency, $f_0$. Whilst embodiments of the invention may exploit PREs formed from LDRs these can be replaced with photodetectors in order to increase $f_0$ which may in some embodiments of the invention be beneficial to reduce noise within the measurement. Accordingly, as depicted a "predistortion" or shaping of the optical illumination waveform may lead to improved linearity in PRE resistance versus time for the transitions whilst driving each pair of PREs provides for no change in the load of the RTH to the input.

For example, within FIG. 6 first and second traces 600B and 600C depict the optical illumination intensity over one cycle of the outputs of Optical Source A 470 and Optical Source B 480 respectively which are employed within the ELEAL 400B and ELEAL 500B in FIGS. 4 and 5 respectively are depicted. Optical Source A 470 being coupled to first PRE 410 (R1) and fourth PRE 440 (R4) whilst Optical Source B 480 is coupled to second PRE 420 *(R2) and third PRE 430 (R3). The optical intensity profile is distorted to reflect the linearity and time constant of the PREs such that with each cycle Optical Source A drives the first and fourth PREs 410 and 440 respectively linearly within the transitions to/from a high resistance state from an initial low resistance state and Optical Source B drives the second and third PREs 420 and 430 respectively linearly within the transitions to/from a low resistance state from an initial high resistance state. The transitions being offset by δt.

The Output LD 460 may be coupled to the output of the bridge circuit via a low power analog-to-digital converter (ADC) for transmission to the ELEAL. Optionally, the electrical link or optical link providing power to the Output LD 460 and its associated electronics may be eliminated and this portion of the RTH powered by a battery.

In applications where noise performance is important then the thermal noise of the RTH or the bridge circuit if integrated within the ELEAL may become important. In such instances, the RTH or bridge circuit may be cooled. Optionally, the cooling may be applied through one or more Peltier elements including, for example, multi-stage Peltier elements, or heat pumps etc. Within other embodiments the RTH or bridge circuit may include a conductive plate coupled to a Dewar vessel forming part of the RTH or ELEAL allowing the cooling to be through filling the Dewar with chlorodifluoromethane refrigerant R-22 (−48.6° C.) or liquid nitrogen (−196° C.) or exploiting subliming carbon dioxide (−78.5° C.).

Optionally, the input 400C of the RTHs 400A and 500A respectively in FIGS. 4 and 5 or input 300A of Bridge Circuit 400A may employ protection circuitry in order to limit the voltage applied to the bridge portion. For example, Zener diodes may be employed as well as transient-voltage-suppression (TVS) diodes.

Within embodiments of the invention the optical sources, e.g. Source A 470 and Source B 480 may be coupled to the RTHs 400A and 500A respectively by optical fibers that are selected in dependence upon the characteristics of the optical emitter/source employed such as singlemode versus multimode, operating wavelength, output power etc. For example, singlemode silica optical fibers may be employed for singlemode visible and near-infrared sources (e.g. 850 nm, 1300 nm, 1550 nm) with typical cores of approximately 10 μm; or multimode silica optical fibers may be employed for multimode visible and near-infrared sources with cores typically 50μ, 62.5μ, 100 μm as well as 200 μm, 300 μm, 365 μm, 400 μm, 550 μm, 600 μm, 800 μm, 940 μm, 1000 μm. 1500 μm and 2000 μm for ultraviolet, visible and near-infrared wavelengths in silica and/or polymer. These may be terminated with collimating optical assemblies to provide Feed 1 415, Feed 2 425, Feed 3 435, and Feed 4 445 with different numerical aperture, beam diameter, etc. as well as lenses etc. Optionally, a single optical fiber may be replaced with an array of optical fibers such as hexagonally packed, rectangularly packed, etc. to provide different beam profiles to couple to the photodiode, phototransistor or LDR. Optionally, the profile of the illumination may be non-uniform where the behaviour of the LDR dictates this.

These optical fibers may be coated with protective polymer coatings and individually cabled with additional physical protection layers such as Kevlar™ and plastic jackets and bundled with further physical protection layers or they may be bundled within a single protective outer either within a single common inner tube or individually within discrete tubes. A single optical connector assembly may be employed in some embodiments whilst in other embodiments two or more optical connectors may be employed. Such connectors may be industry standard formats such as E-2000, FC, MIC, MPO/MTP, SC, SMA, and ST for example as well as many others including industry standard and custom connectors.

Within embodiments of the invention the optical wavelength range employed may be a single optical wavelength (e.g. 533 nm, 850 nm, 1300 nm etc.), multiple optical wavelengths, a broadband emission such as from a superluminescent diode. Examples of optical sources may include semiconductor diodes such as light emitting diodes (LEDs), laser diodes (LDs), vertical cavity surface emitting lasers (VCSELs), gas lasers such as helium-neon (633 nm), Argon ion (multiple wavelengths but commonly 488 nm and 514 nm), krypton laser (multiple wavelengths but commonly 470 nm, 480 nm and 520 nm), helium-cadmium (442 nm), copper vapour (510 nm and 578 nm), carbon dioxide (10.6 μm) and solid state lasers such as diode pumped neodymium-doped yttrium aluminum garnet (Nd:YAG) (1.064 μm). Semiconductor diodes may exploit InGaN (445-465 nm), AlGaInP (635-760 nm), GaAlAs (785-850 nm), AlGaAs (1063 nm), InGaAsP (1310-650 nm) as well as other semiconductors. The figures in brackets are common wavelengths for these semiconductors and do not reflect the range of wavelengths achievable through composition adjustments. Optical powers may vary according to laser type and design from milliwatts (mW) to hundreds of milliwatts (100 s mW), watts (W) to hundreds of Watts and kilowatts (kW).

As depicted within FIGS. 3 to 5 respectively the input, e.g. Input 300A or Input 400C is depicted as a pair of contacts coupled to an upper signal rail and a lower signal rail (not depicted for clarity) such that the bridge circuit or RTH can float with the input rails. Optionally, a rail may be grounded wherein any series resistor between the input and the bridge circuit may be eliminated.

Within FIGS. 4 and 5 the four resistors are depicted as being coupled to a pair of optical sources each of which are optically split to couple to the pair of resistors each optical source is coupled to. Optionally, the splitter may be within the ELEAL rather than the RTH or alternatively four optical sources may be employed within the ELEAL each coupled to one of the LDRs wherein the four optical sources are driven as two pairs through synchronized drive signals.

Accordingly, whilst the descriptions above describe and depict a system it would be evident that a method may be implemented for configuring an electrical test measurement by providing a resistive bridge circuit comprised of light-dependent resistors or light-dependent diodes which is then driven through applying optical pulse signals to drive the bridge resistive bridge circuit. In this manner an electrical test measurement may be performed at point remote from the test instrument with optical isolation of the measurement head from the test instrument. Based upon the electrical measurement being performed a controller within the test instrument may adjust aspects of the optical pulses applied such as repetition frequency, pulse profile, and upper/lower limits of illumination.

Within the descriptions above in respect of embodiments of the invention with respect to a system comprising a resistive bridge circuit in conjunction with a null detector no specific distinction has been made as to whether the devices and/or systems exploiting embodiments of the invention receive direct current (DC) or alternating current (AC) signals. Typically, within the prior art such resistive bridge circuits and null detectors are employed upon DC signals. However, the inventors have established variants of the system which allow for the systems and/or devices according to embodiments of the invention to operate with AC signals.

According to an embodiment of the invention devices and/or systems according to embodiments of the invention may exploit built in synchronization within the devices and/or systems, for example via hardware or firmware, so that two input AC signals, whether current or voltage, can be synchronized prior to comparing the signals via the internal optical bridge and determining the null point. The two input AC signals may be the same frequency, or they may have different frequencies, but their currents or voltages may be compared.

With respect to determining which portion of the applied AC signal is employed to determine the AC null point then this may be any portion of the AC signal as defined by the hardware or firmware. Optionally, the portion of the AC signal employed may be varied within other devices and/or systems according to embodiments of the invention through a selection with respect to the device and/or system itself or through a selection by an external controller in communication with a processor forming part of the device and/or system. Accordingly, the portion of the AC signal may be the positive amplitude magnitude, negative amplitude magnitude, or other portions of the AC signal. Further, within other embodiments of the invention the determination of an AC signal with respect to the null point with respect to the cross-over position of the synchronized signal(s), or unsynchronized signal(s) then the devices and/or systems may be configured to one determination method or they may provide configurability with respect to the determination method. Examples of determination methods may comprise a zero crossing method or a root-mean-square (RMS) method or other predetermined portions.

Within embodiments of the invention a sample-and-hold circuit may be employed for both DC and AC signals so that the null point is determined based on the signal "released" by the sample-and-hold circuit. It would be evident that therefore a sample-and-hold circuit is provided for each input signal. One such sample-and-hold circuit may be based upon the use of a capacitor based circuit which would charge up based on the AC, or DC signal. Accordingly, the capacitance charge level could then be fed into the optical bridge and compared. Beneficially, this would allow an AC signal to be compared with or without having the two input AC circuits synchronized.

Figure 7:
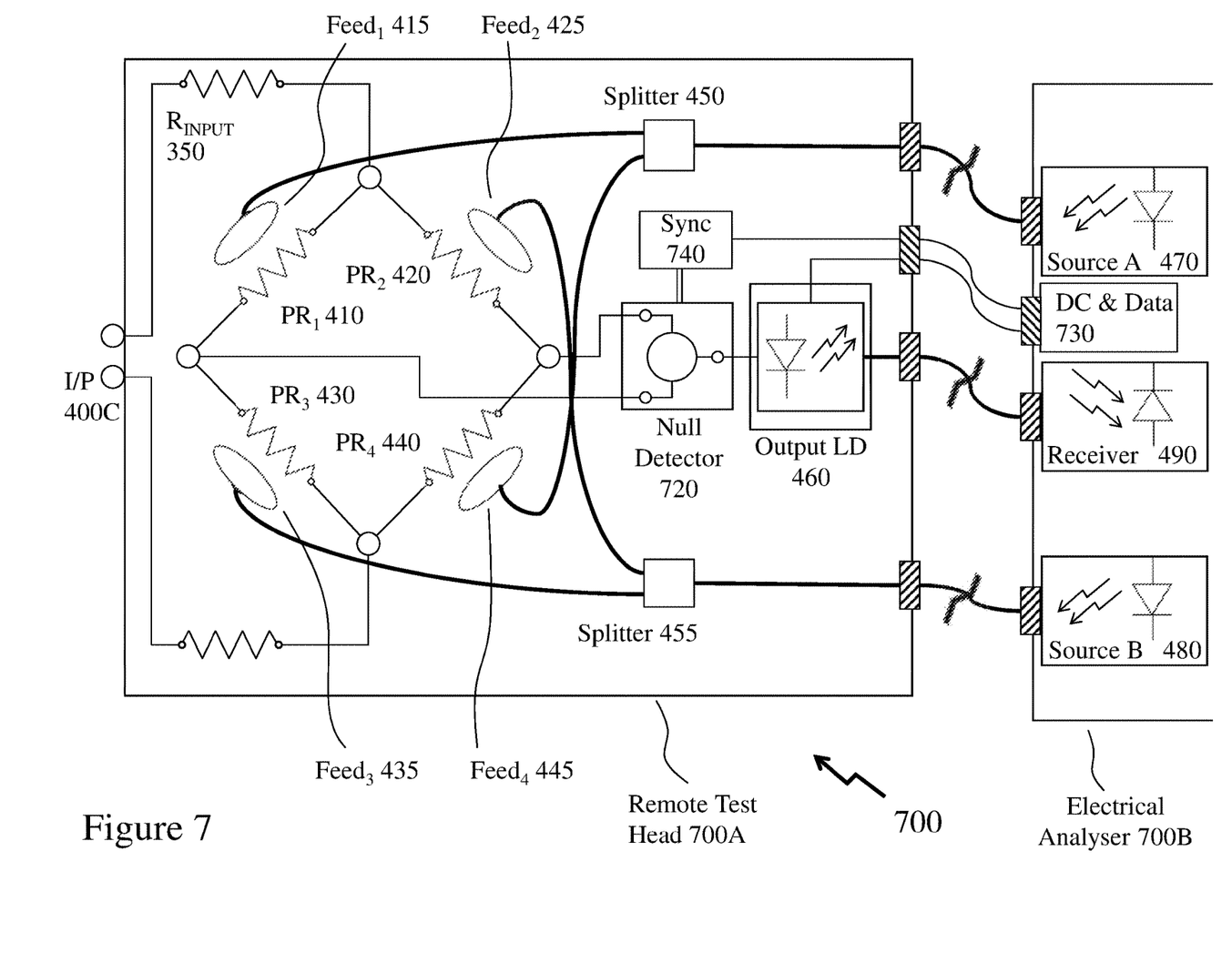
FIG. 7 depicts a resistive bridge according to an embodiment of the invention employing optical driving of the resistors within the resistive bridge with a measurement head separated from the electrical test equipment which includes a null detector optically decoupled from the electrical test equipment.

Now referring to FIG. 7 there is depicted a resistive bridge according to an embodiment of the invention employing optical driving of the resistors within the resistive bridge with a Measurement Head 700A separated from the Electrical Analyser 700B. The Measurement Head 700A includes a null detector 720 which is coupled to the Output LD 460 so that it is optically decoupled from the electrical test equipment. The Null Detector 720 is coupled to a Sync Circuit 740 within the Measurement Head 700A which is coupled to a DC & Data circuit 730 within the Electrical Analyser which now provides DC power to the Sync 740 and Null Detector 720 together with the Output LD 460 but also provides clock and/or data signals to the Sync 740. Within an embodiment of the invention the DC & Data circuit 730 is electrically coupled between the Electrical Analyser 700B and the Remote Test Head 700A whilst within other embodiments of the invention the connections may be optical for data signals and electrical for DC power or optical for both power and data signals.

Figure 8:
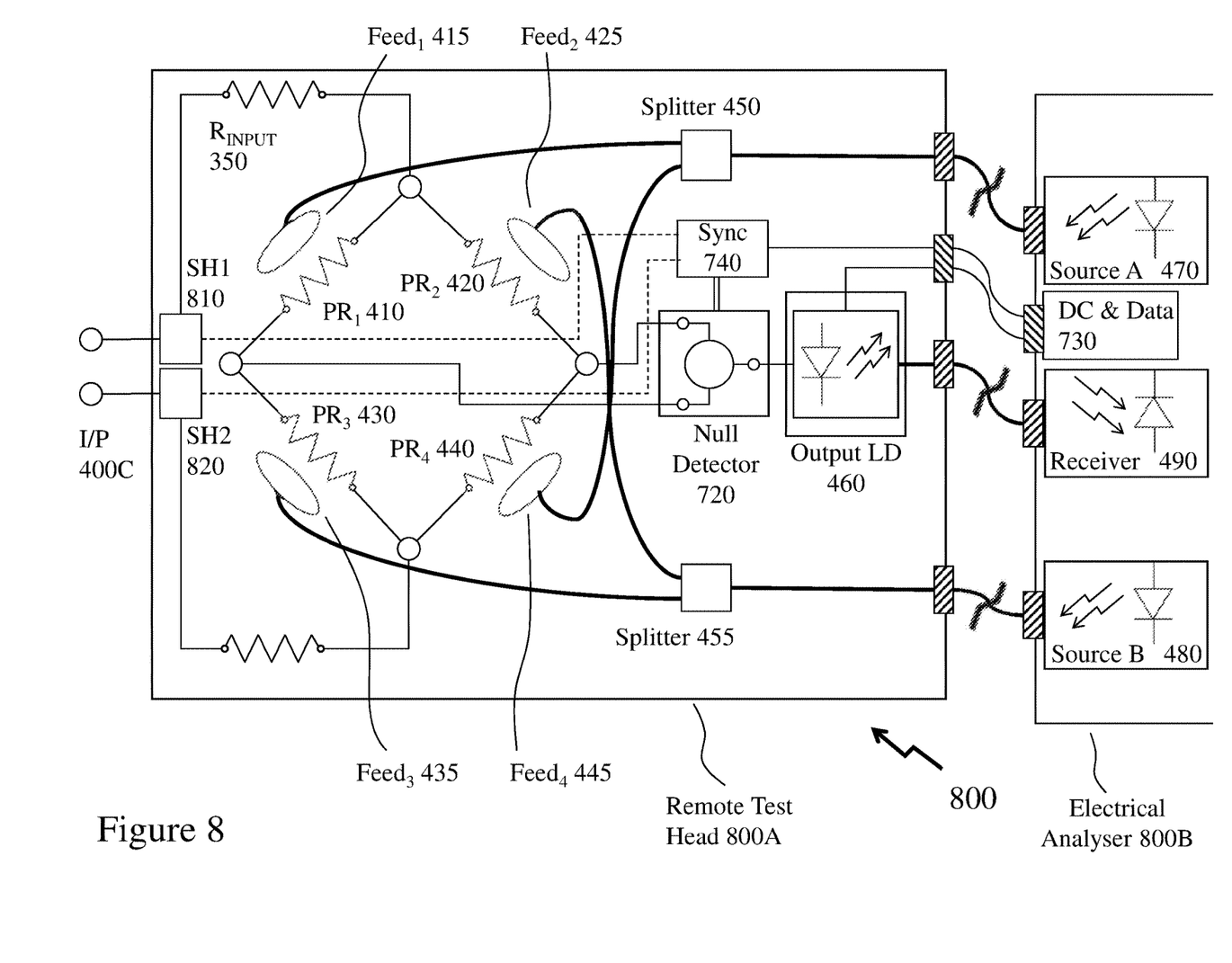
FIG. 8 depicts a resistive bridge according to an embodiment of the invention employing optical driving of the resistors within the resistive bridge with a measurement head separated from the electrical test equipment which includes a null detector optically decoupled from the electrical test equipment and sample-hold circuits on the inputs.

Now referring to FIG. 8 there is depicted a resistive bridge according to an embodiment of the invention employing optical driving of the resistors within the resistive bridge with a Measurement Head 800A separated from the Electrical Analyser 800B. The Measurement Head 800A includes a null detector 720 which is coupled to the Output LD 460 so that it is optically decoupled from the electrical test equipment. The Null Detector 720 is coupled to a Sync Circuit 740 within the Measurement Head 700A which is coupled to a DC & Data circuit 730 within the Electrical Analyser which now provides DC power to the Sync 740 and Null Detector 720 together with the Output LD 460 but also provides clock and/or data signals to the Sync 740. Additionally, the Inputs 400C are now coupled to first and second sample-hold circuits SH1 810 and SH2 820 respectively which are coupled to the Sync Circuit 740 so that these can be "gated" or clocked to provide the signals to the resistive bridge as described above. Within an embodiment of the invention the DC & Data circuit 730 is electrically coupled between the Electrical Analyser 800B and the Remote Test Head 800A whilst within other embodiments of the invention the connections may be optical for data signals and electrical for DC power or optical for both power and data signals.

Accordingly, the resistive bridge within some embodiments of the invention may be decoupled from the electrical test equipment with the optical connections between the measurement head and the electrical test equipment and the null detector is within the electrical test equipment.

Accordingly, the resistive bridge and null detector within some embodiments of the invention may be decoupled from the electrical test equipment with the optical connections between the measurement head and the electrical test equipment with full optical decoupling for all signals including any DC power. In other embodiments of the invention the optical decoupling may be for all AC signals with only DC electrical power between the measurement head and electrical test equipment. Within other embodiments of the invention the optical decoupling may be for all optical signals to the resistive bridge and from an integrated null detector with only DC power and AC data being electrically provided between the measurement head and the electrical test equipment. Optionally, data signals and/or DC power may also be coupled to the measurement head using one or more wireless interfaces according to embodiments of the invention.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the scope of the present invention.

What is claimed is:

1. A device comprising:
an input port comprising an upper signal rail and a lower signal rail;
a first resistor having a first end coupled to the upper signal rail of the input port;
a second resistor having a first end coupled to the upper signal rail of the input port;
a third resistor having a first end coupled to the other end of the first resistor and a second distal end coupled to the lower signal rail of the input port;
a fourth resistor having a first end coupled to the other end of the second resistor and a second distal end coupled to the lower signal rail of the input port;
a first output port coupled to the other end of the first resistor and the first end of the third resistor;
a second output port coupled to the other end of the second resistor and the first end of the fourth resistor; and
one of:
  a null detector coupled to the first output port and the second output port and an optical emitter coupled to the null detector for optically transmitting an output of the null detector to remote test equipment;
  a null detector coupled to the first output port and the second output port, an optical emitter coupled to the null detector for optically transmitting an output of the null detector to remote test equipment, and a synchronization circuit coupled to the null detector for receiving first electrical signals from the remote test equipment and providing second electrical signals to the null detector; and
  a null detector coupled to the first output port and the second output port, an optical emitter coupled to the null detector for optically transmitting an output of the null detector to remote test equipment, a first sample and hold circuit coupled to the upper signal rail, a second sample and hold circuit coupled to the lower signal rail, and a synchronization circuit coupled to the null detector for receiving first electrical signals from the remote test equipment and providing second electrical signals to the null detector and third electrical signals to the first sample and hold circuit and second sample and hold circuit; wherein
  in a first configuration the first resistor and fourth resistor are light dependent resistors which are each optically illuminated with first synchronized optical signals having the same time dependent variation in illumination;
  in a second configuration the second resistor and third resistor are light dependent resistors which are each optically illuminated with second synchronized optical signals having the same time dependent variation in illumination;
  in a third configuration the first resistor and fourth resistor are light dependent resistors which are each optically illuminated with third synchronized optical signals having the same time dependent variation in illumination and the second resistor and third resistor are light dependent resistors which are each optically illuminated with synchronized fourth optical signals having the same time dependent variation in illumination.

2. The device according to claim 1, wherein
the device is coupled to an electrical measurement system via one or more optical fibers or electrical connections.

3. The device according to claim 1, wherein
at least one of:
  the first optical signals coupled to the first resistor and fourth resistor are derived from either a single optical source or a pair of optical sources; and
  when derived from a single optical source a splitter generating the pair of optical signals from the single optical source is within the device or within an electrical measurement system to which the device is coupled via at least one optical fiber;
and
  the second optical signals coupled to the second resistor and third resistor are derived from either a single optical source or a pair of optical sources; and
  when derived from a single optical source a splitter generating the pair of optical signals from the single optical source is within the device or within an electrical measurement system to which the device is coupled via at least one optical fiber.

4. The device according to claim 1, further comprising
a digital processing circuit coupled to the first output port and the second output port for generating a digital signal in dependence upon the electrical signals on the first output port and the second output port;
an optical transmitter coupled to the processing circuit for transmitting the digital signal to an electrical measurement system via an optical fiber.

5. The device according to claim 4, wherein
the digital processing circuit and optical transmitter are electrically powered by at least one of:
  an electrical connection from the electrical measurement system and the device;
  a battery within the device; and
  a power over fiber system between the electrical measurement system and the device.

6. The device according to claim 1, wherein
at least one of:
  in the first configuration the first optical signals have an intensity versus time profile that is defined in dependence upon the characteristics of the light dependent resistors providing the first resistor and the fourth resistor such that a resistance of each light dependent resistor varies with improved linearity; and
  in the second configuration the second optical signals have an intensity versus time profile that is defined in dependence upon the characteristics of the light dependent resistors providing the second resistor and the third resistor such that a resistance of each light dependent resistor varies with improved linearity; and
  in the third configuration:
  the first optical signals have an intensity versus time profile that is defined in dependence upon the characteristics of the light dependent resistors providing the first resistor and the fourth resistor such that a resistance of each light dependent resistor varies with improved linearity;
  the second optical signals have an intensity versus time profile that is defined in dependence upon the characteristics of the light dependent resistors providing the second resistor and the third resistor such that a resistance of each light dependent resistor varies with improved linearity;
  the first optical signals are offset by a predetermined time relative to the second optical signals; and
  the first optical signals are the inverse of the second optical signals.

7. The device according to claim 1, wherein
in the first configuration the first optical signals have a periodic intensity profile at a predetermined frequency;
in the second configuration the second optical signals have a periodic intensity profile at a predetermined frequency;
in the third configuration the first optical signals and the second optical signals each have periodic intensity profiles at a predetermined frequency and are offset relative to each other by a predetermined time.

8. A method comprising:
providing a resistive bridge circuit comprising N light dependent resistors (LDRs) and M=N−4 resistors, where both N is an integer and has a value of $1 \leq N \leq 4$;
driving the N light dependent resistors with R optical signals having a pulse repetition frequency $f_0$ and each pulse having a predetermined intensity profiles; and
one of:
providing a null detector coupled to the first output port and the second output port, and providing an optical emitter coupled to the null detector for optically transmitting an output of the null detector to remote test equipment;
providing a null detector coupled to the first output port and the second output port, providing an optical emitter coupled to the null detector for optically transmitting an output of the null detector to remote test equipment, and providing a synchronization circuit coupled to the null detector for receiving first electrical signals from the remote test equipment and providing second electrical signals to the null detector; and
providing a null detector coupled to the first output port and the second output port, providing an optical emitter coupled to the null detector for optically transmitting an output of the null detector to remote test equipment, providing a first sample and hold circuit coupled to the upper signal rail, providing a second sample and hold circuit coupled to the lower signal rail, and providing a synchronization circuit coupled to the null detector for receiving first electrical signals from the remote test equipment and providing second electrical signals to the null detector and third electrical signals to the first sample and hold circuit and second sample and hold circuit.

9. The method according to claim 8, wherein
one of:
N=1 and R=1;
N=2 and R=2, the R optical signals are provided by S optical sources, where S=1 or 2 and the LDRs are opposing each other such that the optically induced variations in resistance of the LDRs maintain a balanced input; and
N=4 and R=2 or 4, the R optical signals are provided by S optical sources, where S=R/2, and the LDRs are paired with their optical sources such that they oppose each other as pairs and the optically and the optically induced variations in resistance of the LDRs maintain a balanced input.

10. The method according to claim 8, wherein
at least one of:
the R optical signals are provided S optical sources, where S=R/2; and
the optical splitters for each of the S optical sources are disposed either within a remote measurement head attached to an electrical measurement system via one or more optical cables or within the electrical measurement system and coupled to the remote measurement head via the one or more optical cables; and
the bridge circuit forms part of a remote measurement head attached to an electrical measurement system by one or more optical cables;
the output of the resistive bridge circuit is digitized and transmitted from the remote measurement head to the electrical measurement system via an optical transmitter within the remote measurement head.

11. The method according to claim 8, wherein
the resistive bridge circuit is coupled to a remote measurement test system by only one or more first optical fibers and one or more second optical fibers;
the one or more first optical fibers couple to the resistive bridge circuit a plurality of first optical signals transmitted by the remote measurement test system to configure the resistive bridge circuit; and
the one or more second optical fibers couple to the remote measurement system from the resistive bridge circuit a plurality of second optical signals to provide measurement data to the remote measurement system for determining a characteristic of a source coupled to the resistive bridge circuit;
the one or more first optical fibers couple optical signals configured to minimize crosstalk between the modulating signals applied to the resistive bridge circuit and the source during balancing of the resistive bridge circuit; and
the one or more second optical fibers electrically isolate the resistive bridge circuit from the remote measurement system to minimize input bias current within the resistive bridge circuit when connected to the source.

* * * * *